COMPONENT MOUNTING ASSEMBLY AND METHOD

Filed June 14, 1967 2 Sheets-Sheet 1

COMPONENT MOUNTING ASSEMBLY AND METHOD

Filed June 14, 1967 2 Sheets-Sheet 2

United States Patent Office 3,483,966
Patented Dec. 16, 1969

3,483,966

COMPONENT MOUNTING ASSEMBLY AND METHOD

Donato F. Dagnoli, Adams, Charles R. Jaeschke, Cheshire, and Arthur K. Hooks, Williamstown, Mass., assignors to Sprague Electric Company, North Adams, Mass., a corporation of Massachusetts Filed June 14, 1967, Ser. No. 646,039
Int. Cl. B65d 73/02, 75/30
U.S. Cl. 206—56 12 Claims

ABSTRACT OF THE DISCLOSURE

An electrical component is secured to a mounting support which includes spaced apart electrodes laminated between insulative layers. At least two of the electrodes extend beyond the perimeter of the support and provide tabs at one end for connection to the component and terminals at the other end for external connection to the assembly.

BACKGROUND OF THE INVENTION

The present invention relates to a mounting assembly for electrical components or modules and more particularly to a compact, light weight assembly suitable for high temperature use in microelectronic circuits and to a method of making the same.

In the prior art, installation of multiple lead electrical components such as transformers and modules has been performed primarily by individually connecting each of the several leads to the proper circuit terminals. More recently, such components have been mounted upon miniature printed boards which provide the necessary connection terminals. Generally, these boards are produced by etching the desired electrode pattern into the metal face of a metal coated fiber or insulated board, or alternatively by vacuum depositing the desired circuit pattern upon such a board. The more recently developed electron beam methods have also been used in this area.

In many cases, the support structures are not suitable for automated construction of the mounting assembly, nor for rapid interconnection of the assembly to its circuit matrix. Moreover, prior art units are generally limited to a narrow temperature range and fail to provide adequate means for testing of the assembly.

It is an object of this invention to provide a component mounting assembly which is suitable for automated mass production of mounted multiple lead components and provides convenient terminals for secure, accurate and rapid mounting upon ceramic or other matrixes, such as those presently used in computer assembly.

Another object of this invention is to provide a component mounting assembly having convenient test leads which may be economically removed just prior to connection of the mounting assembly in its circuit.

Yet another object of this invention is to provide a multiple lead component mounting assembly which is superior to circuit board assemblies in that in addition to providing component support and lead protection, it further supplies a convenient carrier suitable for testing and shipping, from which the component assembly may be automatically removed prior to, and for, circuit connection.

A further object of this invention is to provide a mounting assembly having component lead connections in which tabs are folded around and welded to the leads through their insulation.

A still further object of this invention is the provision of a multiple lead mounting assembly whose temperature capability range is approximately −55° C. to +265° C.

A further object of this invention is to provide a method of assembly suitable for automated mass production of a carrier and mounting support in accordance with the invention.

Other objects and advantages of the present invention will be made obvious to those skilled in the art by the following description when considered in relation to the accompanying drawing.

SUMMARY OF THE INVENTION

Broadly, a component mounting assembly constructed in accordance with the invention comprises a mounting support which includes an electrode configuration laminated to at least one insulative support layer with tab and terminal portions of the electrodes extended beyond the perimeter of the support, and at least one multi-lead component is arranged on the support layer in connection to the tabs.

In a more limited sense, the assembly includes a three-ply lamination in which spaced-apart electrodes are sandwiched between two insulative layers to provide a mounting support. The tabs are folded around the insulated leads of the component and welded directly through the insulation. The insulative layers are joined to a carrier strip by at least one bridging portion, and the terminals include test extensions which are supported by the carrier strip.

Briefly, the method of constructing a component mounting strip includes the steps of: forming an electrode configuration in a conductive metal strip; forming a support portion, having less area than the electrode configuration, in an insulative strip, the support portion being retained in the strip by at least one bridge of insulative material; bonding the conductive and insulative strip together in a laminated structure with the support portion generally centered within the electrode configuration so as to allow tab and terminal portions of the electrodes to extend beyond the perimeter of the insulative support.

In a more limited sense, the method additionally includes: forming test extensions in the conductive strip in connection to the terminal portions of the electrodes; forming a test aperture in the insulative strip adjacent the support portion, said aperture positioned so as to expose at least part of the test extensions; and cutting the tab portions and ends of the test extensions free from the surrounding strip after laminating to provide a testable support portion secured to a surrounding carrier strip.

In a still more limited sense the method includes: mounting a component having insulated leads on the insulative support portion; folding the extended tabs around the end of the component leads; and welding folded tab portion to connect the lead and tab.

DESCRIPTION OF THE PREFERRED EMBODIMENTS

Figure 1:
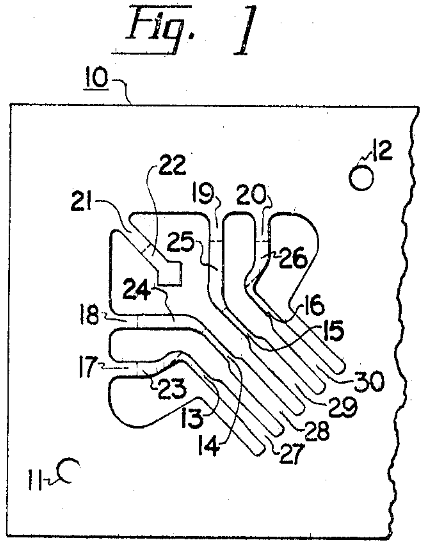
FIGURE 1 shows the electrode pattern of the conductive metal element of a preferred assembly which has been punched into an elongated strip.

FIGURE 1 shows a single electrode pattern which is repeatedly formed in a conductive metal strip 10. Only a portion of strip 10, which may be several feet in length, is shown. The circular holes 11 and 12 are initially formed in the strip to provide proper and accurate alignment of the electrode pattern to be later punched. It is of extreme importance that these alignment cavities 11 and 12 be accurately spaced in each case so that the various layers will properly overlie each other in the laminated unit.

The electrode configuration, which is punched or otherwise formed in strip 10, includes electrode extensions 13, 14, 15, and 16, hereinafter referred to as the terminals. These are punched into the metal so as to provide a configuration coinciding with the terminals of the circuit matrix to which they will be attached at a later time. Opposite the terminals, the electrodes 17, 18, 19, and 20, and including electrode 21, hereinafter referred to as the tabs, are arranged in any convenient order to suit the component. The electrode portions 23, 24, 25, and 26 which lie between the dotted lines serve as the electrode proper and connct tabs 17, 18, 19 and 20 to terminals 13, 14, 15, and 16. Tab 21, however, which has an electrode portion 22 extended only to the center of the configuration, is for use as a tie point and thus does not connect to a terminal. Finally, terminals 13, 14, 15, and 16 also have large area extensions 27, 28, 29, and 30 which lead away from the central area of the pattern and are employed for testing of the completed assembly.

In the preferred embodiment, strip 10 is approximately 1 inch wide and .005 inch thick, gold plated copper. The alignment holes 11 and 12 are about ⅛ inch in diameter and the diagonal of the electrode pattern is approximately ¾ of an inch.

The pattern is punched in strip 10 to provide a width of about .020 inch for the tabs and the connecting electrodes. The separation between adjacent tabs and electrodes is approximately .060 inch in this embodiment but may easily run as low as .030 inch or less.

The terminals are approximately .015 inch wide whereas the heavier test extensions are made approximately .040 inch wide. The separation between terminals is about .050 inch and the separation between test extensions is about .020 inch. Finally the length of the tabs, terminals, and test extensions are such as to permit approximately ⅛ inch of each to be exposed in the completed laminate described below.

Figure 2:
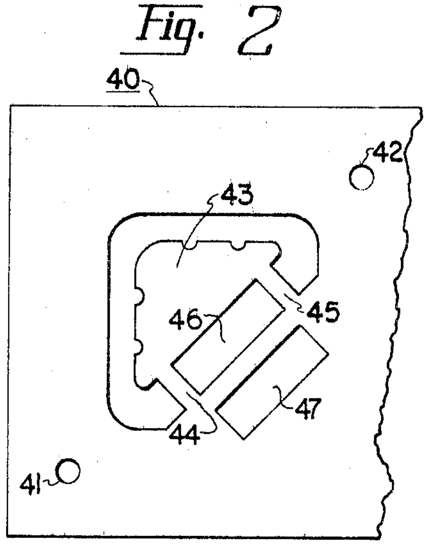
FIGURE 2 shows the lower insulator pattern of a preferred assembly which has been punched into an elongated strip.

FIGURE 2 shows a first strip 40 of insulator material. In the preferred embodiment, this lower strip and a second, or upper insulator strip 50 described below, consist of a polyimide film of excellent electrical character and high temperature capability; for example polypyromellitimide. The alignment cavities 41 and 42 are punched so as to exactly coincide with holes 11 and 12 of FIGURE 1. Thereafter, a pattern is formed by punching, or the like, in film 40, which is to serve as a lower support for the electrode structure of FIGURE 1. This pattern is punched to provide a central support portion 43 which in the laminated assembly provides support for the electrode sections 22, 23, 24, 25, and 26, while leaving their extensions accessible from above and below.

Central portion 43 remains attached to the main body of the insulator strip 40 by means of bridges 44 and 45 of the insulative material. These bridges hold the center rigid and allow only slight oscillation in the vertical plane. The bridges, which may be of any number so long as they provide the necessary support and rigidity, are arranged so as not to lie under either the terminals or tabs of the electrode pattern of FIGURE 1. Openings 46 and 47 are provided in strip 40 for access to terminals 13, 14, 15, and 16 and their test extensions 27, 28, 29, and 30, once the layer of FIGURE 1 is superimposed upon layer 40 of FIGURE 2.

Depending upon the size of the component to be mounted and the mounting which it demands, any number of these electrode and support patterns may be punched into elongated strips of the metal and insulative material, which are automatically unwound before punching and rewound after punching, or passed through the entire assembling process as a continuous strip.

Figure 3:
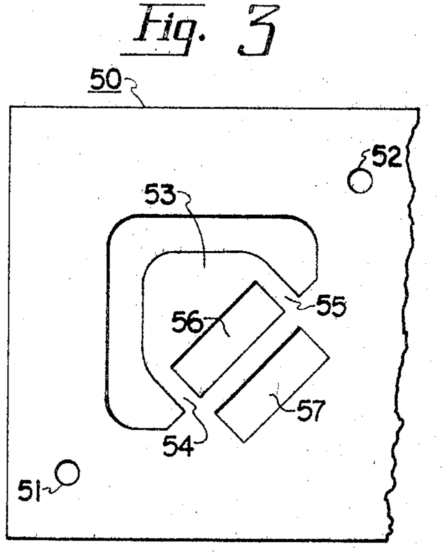
FIGURE 3 shows the upper insulator pattern of a preferred assembly which has been punched into an elongated strip.

FIGURE 3 shows a stamped insulator strip 50 of the same, or different, insulative material as strip 40. In the preferred embodiment, the characteristics of this second, or upper layer are identical to those of layer 40, however, this layer may also be of any insulative material depending upon the use to which the ultimate mounting will be put. Once again alignment cavities 51 and 52 are initially formed by punching, or the like, so as to provide coincidence with cavities 11 and 12 of the metal strip and 41 and 42 of the lower insulator layer. A central support portion 53 is also provided in strip 50. This is similar in shape, but slightly smaller than portion 43 in the preferred embodiment so that portion 43 extends approximately 1⁄16 of an inch beyond the outer edge of the former in the laminated unit at those points where tabs 17, 18, 19, 20 and 21 extend. Portion 53 is also attached to the main body of the film strip by bridges 54 and 55, and openings 56 and 57 are provided for access to the terminals and test extensions, as in strip 40.

Figure 4:
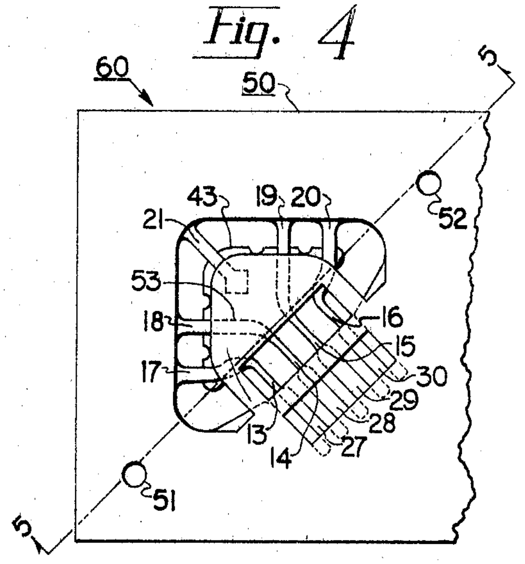
FIGURE 4 is a plan view of a three layer laminated assembly of the strips of FIGURES 1, 2 and 3.

FIGURE 4 shows the laminated substrate which is formed by sandwiching the three strips, 10, 40 and 50 together, with adhesive material on the upper face of film 40 and the lower surface of insulator strip 50. Proper alignment is provided by means of aligning holes 11, 41, 51, and holes 12, 42, and 52. Thereafter, the laminate is completed by applying mechanical pressure to the assembly and heating it to bond the three strips together. This yields the three layer laminate of FIGURE 4, hereinafter referred to as the substrate 60.

Figure 5:
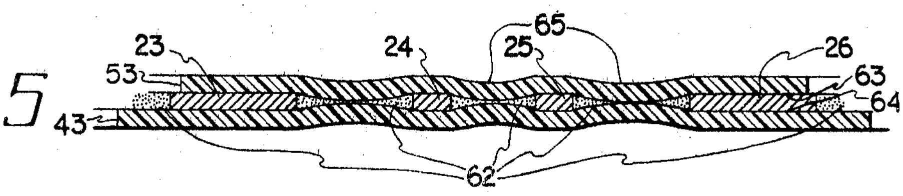
FIGURE 5 is a detailed sectional view along the line 5—5 of FIGURE 4.

FIGURE 5 shows a central mounting portion in section of substrate 60 along the line 5—5 of FIGURE 4. The electrode strip 10 is sandwiched between lower insulator strip 40 and upper insulator strip 50, with electrodes 22, 23, 24, 25 and 26 sandwiched between lower portion 43 and upper portion 53. The insulator strips are secured to each other by an adhesive layer 62 and a small amount of this adhesive material also lies between the metallic and insulator strip layers at points such as 63 and 64.

In the preferred embodiment, one or both insulative strips is made to conform to the electrode pattern, as shown at 65. This improves the bond of the laminate and reduces the possibility of lateral movement of the electrodes. Moreover, it insulates between electrodes as well as over them and thus minimizes problems of distortion which may occur during processing.

The adhesive material used in the lamination will, like the insulator layers, vary depending upon the ultimate application of the mounting. Epoxy and polyimide resins have been found to be most practical since these have a broad temperature capability, suitable for use in the computer field.

Heat sealable film can also be employed. For example, in the preferred embodiment, the indicated adhesive is replaced with a thin surface layer of a fluoroethylene polymer, known as F.E.P. Teflon. In this embodiment, insulative strips 40 and 50 comprise a .005 inch thick layer of polypyromellitimide having a .001 inch thick surface film of the fluoroethylene polymer. The latter film, which may be deposited or formed on the thicker layer or thermally sealed to it, is only required on the inner surfaces of the insulative strips; that is on the surface of each layer which is positioned next to the electrode strip.

In this embodiment, strips 40 and 50, of the above material, were passed through a methyl chloroform bath, prior to assembly as substrate 60, so as to remove any impurities. Thereafter these strips were sealed to strip 10 and each other by application of a temperature of from 245° C. to 250° C.

Figure 6:
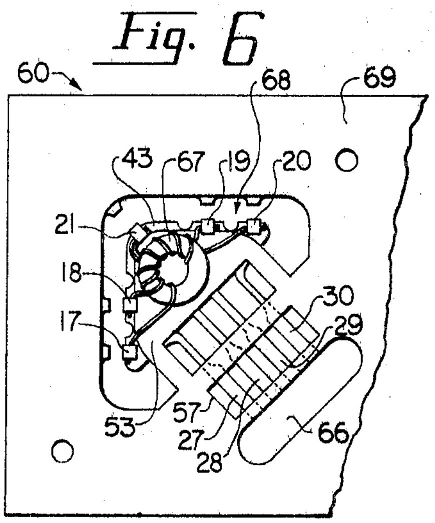
FIGURE 6 shows a preferred component mounted upon the laminated substrate structure of FIGURE 4 and secured in position by means of tabs folded over and joined to its lead wires.

Once laminate 60 is complete, the tabs 17, 18, 19, 20, and 21 are cut at their outermost end and folded upward through an obtuse angle of about 170° so as to overlay themselves, as shown in FIGURE 6. It should be noted, that the lower mounting support 43 exceeds the perimeter of the upper support 53 in the tab area and supports the tabs in the folded condition. In the same operation a large opening, or orifice 66, is punched through substrate 60 so as to cut the ends of test extensions 27, 28, 29, and 30 free from the sandwiched strip 10. The component, which in this preferred application is a coil 67, is placed upon the upper surface of substrate 60 and secured in place by passing its lead wires under appropriate folded tabs 17, 18, 19, 20, and 21, as shown.

It should be noted that tab 21 merely provides a convenient splice point and does not extend through the support mounting 68 to any of the terminals. This tab is employed to interconnect leads of the unit and need not be utilized in some mounting arrangements, however, its inclusion in the laminated substrate provides a more adaptable mounting strip.

The folded tabs 17, 18, 19, 20 and 21 with wires sandwiched in between, are then twice welded in the preferred embodiment using a parallel gap welder. The first weld is made such that the welding current flows parallel to the wire. This connecting method is of course subject to modification, and in particular is dependent upon the final application of the mounting.

This sandwich welding provides an excellent connection of the tab to the #38 copper lead without prior removal of the lead insulation. The method is to fold the tab around the insulated lead so as to make a sandwich. A parallel gap AC welder is then applied to the flap. The welding gap is positioned across the lead so that the current is perpendicular to the lead. Finally, the welder is applied parallel to the wire. This method bonds the tab to the lead through its insulative coating and not only eliminates prior removal of the insulation, but, more importantly, retains wire insulation up to the folded connection; such that lead shorting under close tolerance assembly is eliminated.

With the wires welded securely in place, the leads are then severed at the edge of the lower support member 53. This yields the mounted components assembly 68, with readily accessible terminals and test extensions, supported by the insulator bridges 44, 45, 54, 55 to its carrier strip 69. This assembly is then sprayed with an insulator varnish to insure electrical and moisture insulation as well as to further secure the component to the substrate structure.

The component assembly may then be electrically tested while in the supported position, by contacting test extensions 27, 28, 29, and 30 through the test apertures or orifices 47 and 57 of either insulative strip. In this figure, upper aperture 57 is shown, however lower aperture 47 is also available for contact from the lower side of the assembly. It should also be understood that access for test is necessary from only one side and thus, a test aperture is needed in only one insulative strip. Preferably, this will be the upper strip.

Figure 7:
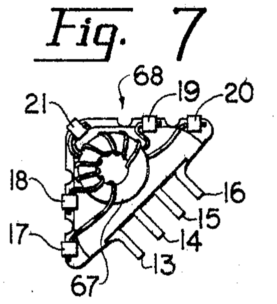
FIGURE 7 is a plan view of the assembled unit separated from its carrier and ready for mounting on a ceramic or other matrix.

The mounted component assembly 68 is removed from the carrier strip 69 by severing terminals 13, 14, 15, and 16 and the insulative bridges to provide the unit shown in FIGURE 7. The terminals are severed within opening 57 by cutting them near the outermost edge of this aperture, and the bridges are cut close to the assembly proper 68 to yield the component assembly having extended accessible terminals as shown.

As indicated the device may be shipped in its carrier strip, in which case it may be again tested, just prior to severance and incorporation in the overall circuit. Alternatively, terminals 13, 14, 15, and 16 may be severed before shipping. In this case, the carrier strip continues to protect the unit which is retained by the bridges, however, the test extensions 27, 28, 29, and 30 will no longer be useful.

The variations to which this method may be subjected as well as the variety of materials which may be used is almost endless. The electrode members, which also constitute the tabs terminals and test extensions, may consist of any conductive metal capable of being processed in the manner required. In the preferred embodiment, for example, they consist of gold plated copper, however, other metals such as silver, nickel and any of the nickel alloys would be suitable.

The insulator material will vary according to two principal factors; that is the amount of support which is needed during assembly, and the temperature and mechanically strength which must be possessed by the final mounting.

In the preferred embodiment, the insulator layers consist of polyimide film, which possess broad range temperature stability and high physical strength, such that they are suitable for computer and military application. Other insulative materials including organic polymers, paper and cellulose acetate films are suitable, depending upon the temperature requirements of the mounting application.

The number of insulator strips is also subject to variation. For example, the substrate may utilize a single insulator strip. In this case, the component is mounted upon the insulative surface opposing that to which the electrode members adhere. Such a structure is useful where the circuit module provides its own insulative protection from the electrode pattern. Moreover, each insulative strip may be a composite, or a laminate, rather than a single film of homogeneous material.

Advantageously, the component to be mounted may consist of any multiple lead electrical device and the material used in its construction may vary with the ultimate application. In a preferred embodiment, the pulse transformer coil 80 is wound with a polyimide insulated copper wire; for example, polypyromellitimide insulation is suitable. This provides a high temperature coil mounted on a substrate of similar capability, and results in a unit capable of −50° C. to +265° C. operation. This range can be further extended to 350° C. by employing only polypyromellitimide mounting layers, or by increasing the temperature capability of the adhesive material employed.

The ability of the mounted devices to be shipped with its carrier, opens up a broad range of possibilities for this assembly technique. The overall structure provides a protective shipping medium for the component in a convenient rolled form, which can be easily adapted (with cooperation between the mounted component supplier and the assembler) for automated testing, cutting and connection in its final circuit.

Advantageously, the shape of the mounting is also adjustable to the individual application. The shape shown in FIGURES 1–7, for example, makes a mounting assembly suitable for planar attachment to the corner section of a ceramic matrix.

Figure 8:
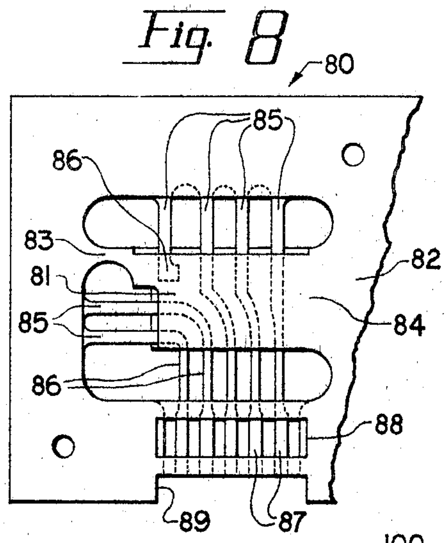
FIGURE 8 shows an alternative mounting strip.

FIGURE 8 shows an alternative structure 80 which ultimately provides a component assembly suitable for vertical mounting on a matrix after a 90° fold of the terminals. This substrate 80 which is a three layer laminate similar to that of FIGURE 4, provides a support portion 81 which is joined to its carrier strip 82 by insulative bridges 83 and 84. As in the previous embodiment, the electrode pattern provides connecting tabs 85 arranged around the perimeter of the mounting portion 81 and terminals 86 which extend from one edge. Here again, one tab, 86, is merely a tie point, or splice tab, and does not connect to a terminal.

Wide test extensions 87 of the terminals are provided for testing. Access to these is made through a test aperture 88 of carrier strip 82. These test extensions 87 are released or disconnected from the main body of the metal strip of the laminate by a cut, or aperture 89, made adjacent the test aperture. In addition to overall shape variation, other modifications of the mounting are made clear from a study of FIGURES 8 and 9. The coil 90 of FIGURE 9, for example, has several more turns than that of FIGURE 6 and an increased number of leads extending therefrom.

Figure 9:
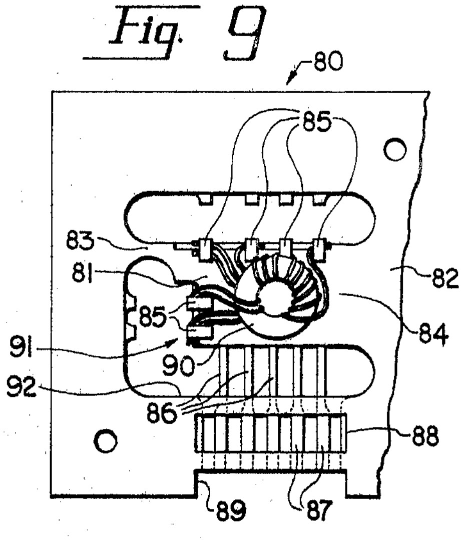
FIGURE 9 is a plan view of an assembled unit employing the laminated strip illustrated in FIGURE 8.

In FIGURE 9, the tab members 85, each have a number of leads connected thereto; varying in number from 1 to 4. The mounting of FIGURE 9 further provides six tabs and five terminals instead of the five tabs and four terminals of FIGURE 6. Hence, many shapes or arrangements of electrodes may be made so as to produce a desired terminal configuration and overall article shape by simply varying the dies used to punch the electrode and support layer patterns. However, the physical arrangement of the layers in the sandwich of FIGURE 9 is generally the same as that of FIGURE 6.

As in the previously described embodiment, the mounting arrangement 91 of FIGURE 9 may be shipped within its carrier 82. This protects the unit and allows repetitive test of it before removal and insertion in the final circuit module.

The component mounting assembly 91 is removed from its carrier 82 by cutting terminals 86, near the inner carrier edge 92, and bridges 83 and 84 close to the perimeter of mounting support 81. At this point, the rectangular assembly 91 is then available for circuit use. This unit is suited for connection, by its terminals 86, to the edge of a circuit substrate in an upright position. A number of these, utilized on the same circuit substrate provides a compact circuit module.

Figure 10:
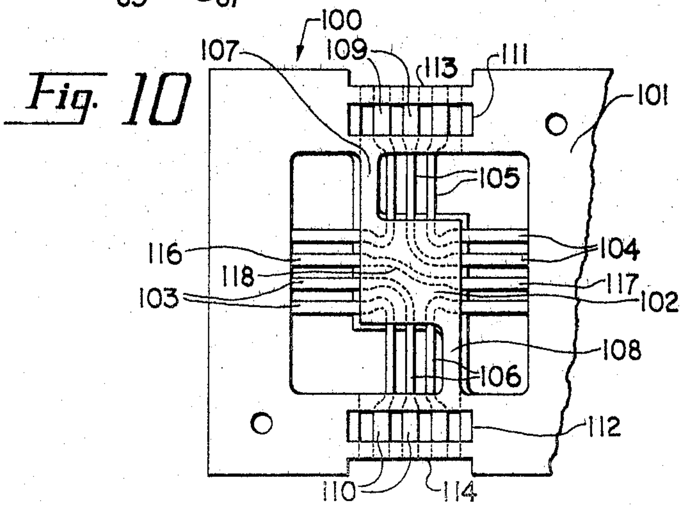
FIGURE 10 illustrates a further modification of the laminated mounting strip.

In FIGURE 10, a still further modification is shown. Herein, a substrate 100 includes a carrier strip 101 and a central mounting support 102. Again, the three ply construction is employed as in the other embodiments, with however, a different pattern arrangement.

In this example, the mounting support 102 is a generally square portion having a plurality of connection tabs 103 and 104 extended from two opposing edges of its perimeter and a plurality of terminals 105 and 106 extended from the two remaining edges. The support portion 102 is connected to carrier strip 101 by insulative bridges 107 and 108. Test extensions 109 and 110 are also provided for each set of terminals so as to allow controlled testing while the completed unit (not shown here) is still retained within the carrier strip. For testing, access apertures 111 and 112, respectively, are provided in the vicinity of the test extensions, and the latter are released, or disconnected, from the conductive strip by cuts, or apertures 113 and 114, made at opposing edges of the strip.

This substrate provides a support 102 having eight tabs and six terminals. As can be seen, two tabs 116 and 117 are interconnected by electrode 118 and do not have terminal connections. This allows these tabs to be employed for a crossover connection for splicing or the like. Of course, these tabs, like the splice point of the other embodiments can only be tested indirectly (through the component) from the terminals or test extensions. This crossover, need not be employed in all instances, however, its inclusion results in a more adaptable substrate.

Thus there is provided not only a unique assembly technique and mounting assembly, but also a testing and shipping means which facilitates and expedites the construction of highly reliable electronic devices. Consequently, since it is obvious that many changes and modifications can be made in the above-described embodiments without departing from the nature and spirit of the invention, it is to be understood that the invention is not limited except as set forth in the appended claims.

What is claimed is:

1. A component mounting assembly comprising a laminated mounting support having a plurality of spaced apart electrodes laminated between upper and lower insulative film layers, said layers bonded to opposed sides of said electrodes for providing support thereof and insulative spacing therebetween, at least two of said spaced apart electrodes extending at both ends beyond the perimeter of at least said upper layer, one end of each of said extended electrodes folded upward and back to within the perimeter of at least the lower layer to provide a tab for connection to a component, the other end of each of said extended electrodes providing a terminal for connection to external circuitry, and at least one multi-lead component arranged on said laminated support with leads of said component in connection to said folded tabs.

2. An assembly as claimed in claim 1 wherein said mounting support is joined to a carrier strip by bridging portions of at least one of said layers, and said terminals include test extensions which are exposed in a test aperture of said carrier strip to permit electrical testing of said assembly both before and after shipping without contacting said terminals.

3. An assembly as claimed in claim 2 wherein said mounting support is substantially triangular in shape and said tabs extend from two edges and said terminals extend from the remaining edge thereof.

4. An assembly as claimed in claim 2 wherein said mounting support is substantially rectangular in shape, and said tabs extend from adjoining edges and said terminals extend from at least one of the remaining edges thereof.

5. An assembly as claimed in claim 2 wherein said mounting support is substantially rectangular in shape, and said tabs extend from two opposing edges and said terminals extend from the remaining edges thereof.

6. An assembly as claimed in claim 2 wherein said tabs are folded upward through an obtuse angle around the lead wires of said component and welded thereto.

7. An assembly as claimed in claim 2 wherein said insulator consists of a polyimide resin film.

8. An assembly as claimed in claim 2 wherein said electrode pattern consists of gold-plated copper material.

9. An assembly as claimed in claim 2 wherein a polyimide resin adhesive is used to laminate said metal electrodes to said insulator layer.

10. An assembly as claimed in claim 2 wherein said component is a toroidal pulse transformer.

11. An assembly as claimed in claim 2 wherein said electrode configuration includes at least one tab without a connecting terminal.

12. An assembly as claimed in claim 11 wherein said one tab is connected by an electrode to a tab of another edge to provide a crossover means.

References Cited

UNITED STATES PATENTS

| | | | |
|---|---|---|---|
| 3,271,625 | 9/1966 | Caracciolo | 317—101 |
| 3,046,452 | 7/1962 | Gellert | 174—52 X |
| 3,289,045 | 11/1966 | Pritikin et al. | |

FOREIGN PATENTS

| | | |
|---|---|---|
| 1,021,579 | 3/1966 | Great Britain. |

MARTHA L. RICE, Primary Examiner

U.S. Cl. X.R.

317—101; 174—52; 336—65, 192